(12) United States Patent
Fisher

(10) Patent No.: US 6,339,348 B1
(45) Date of Patent: Jan. 15, 2002

(54) PROGRAMMABLE NON-OVERLAP TIME OUTPUT DRIVER

(75) Inventor: Justin R. Fisher, Warwick, RI (US)

(73) Assignee: Semiconductor Components Industries LLC, Phoenix, AZ (US)

(*) Notice: Subject to any disclaimer, the term of this patent is extended or adjusted under 35 U.S.C. 154(b) by 0 days.

(21) Appl. No.: 09/660,449

(22) Filed: Sep. 12, 2000

(51) Int. Cl.[7] .................................................. H03K 3/00
(52) U.S. Cl. ...................................... 327/108; 327/112
(58) Field of Search .............................. 327/108, 112, 327/269, 270, 263, 120, 121, 122, 258, 295

(56) References Cited

U.S. PATENT DOCUMENTS 5,208,776 A   5/1993  Nasu et al. .................. 365/200
5,610,548 A * 3/1997  Masleid ....................... 327/374
5,708,386 A * 1/1998  Chow .......................... 327/380
6,073,246 A * 6/2000  Song et al. .................. 713/401

* cited by examiner

Primary Examiner—Timothy P. Callahan
Assistant Examiner—Linh Nguyen

(57) ABSTRACT

An integrated circuit and method for setting non-overlap time in a staggered dual output driver relies upon selection from a plurality of delay paths. A cross-conduction prevention circuit provides a first output signal to a first feedback path and a second output signal to a second feedback path. A plurality of delay paths are selectively inserted into one or both of the feedback paths. Non-overlap times for the driver are detected for each of the tested delay paths. In one or both feedback paths, a tested delay path is set for indefinite or permanent use by the staggered dual output driver.

23 Claims, 2 Drawing Sheets

PROGRAMMABLE NON-OVERLAP TIME OUTPUT DRIVER

FIELD OF THE INVENTION

The present invention relates to a driver for switching on and off stacked transistor circuits, and in particular, relates to the non-overlap time between the signals for the top transistor circuit and the bottom transistor circuit.

Design of a push-pull or totem pole driver on a switch mode power supply must ensure that both output devices are not switched on at the same time as this may lead to the destruction of either or both output transistor circuit devices. In order to achieve this, a cross-conduction circuit is built into the control chip. A cross-conduction prevention circuit is shown in FIG. 1. This circuit is designed to prevent both output devices MP1 and MN1 from being on at the same time. An input signal is sent to a NAND gate G2 and a NOR gate G1. The output from the NAND gate G2 is fed back to an input to the NOR gate G1. The output from the NOR gate G1 is fed to an input to the NAND gate G2. Inverters G3, G4 follow each of the logic gates providing additional delay in their respective circuit paths. In operation, when the input signal goes high for example, MP1 will be shut off before the high signal through the feedback path to the NAND gate G2 is able to turn on the bottom output device of MN1. While this circuit prevents cross-conduction, the inventor has recognized that the non-overlap time between the staggered outputs to the top and bottom outputs is a critical design tradeoff. If the non-overlap time is too small, the output devices can self-destruct. If the non-overlap time is too large, power supply efficiency is compromised.

BACKGROUND OF THE INVENTION

In accordance with an embodiment of the method of the present invention, non-overlap time can be set for a staggered dual output driver to a desired value. A staggered dual output driver as used herein is one that provides drive signals to top and bottom outputs and encompasses push-pull drivers and totem pole drivers. Integrated circuits are provided with a plurality of delay paths for selective insertion in a feedback path between a first output and a logic gate for generating a second output. For each of the selectively inserted delay paths, the non-overlap time is detected. The integrated circuit is then set so as to use one of the tested delay paths. In a preferred embodiment, the integrated circuit has a plurality of paired delay paths, each pair of delay paths having one delay path for insertion in a first feedback path between a first output and a second logic gate for generating the second output and a second delay path for insertion in a second feedback path between the second output and a first logic circuit for generating the first output. The delay paths are tested in pairs. After testing, one of the delay path pairs is selected for use in the integrated circuit. In a preferred embodiment, an encoder produces signals that select from among the delay paths. A signal sent to the encoder can permanently select one of the delay paths or delay path pairs.

The staggered dual output circuit of an embodiment of the invention includes a first logic circuit that generates a first output and a second logic circuit that generates a second output. Each of the logic circuits has a feedback path leading from its output to the other logic circuit. An encoder is included on the circuit permitting selection of any of a plurality of delay paths for insertion into one or both of the feedback paths. In a preferred embodiment, a pair of delay paths for insertion into each of the first and second feedback paths is selected.

In accordance with a further aspect of the invention, a staggered dual output driver includes a cross-conduction prevention circuit that provides a first output signal to a first feedback path and a second output signal to a second feedback path. A plurality of delay paths is provided for selective insertion into one or both of the feedback paths.

In accordance with a still further aspect of the invention, a first plurality of delay paths and a second plurality of delay paths emanate from a logic circuit. The integrated circuit includes a circuit for converting an input into a pair of successive signals. A selection input to the logic circuit is used to determine which of the delay paths will conduct between the pair of successive signals and top and bottom outputs.

Various embodiments of the invention permit the production of totem pole and push-pull drivers with accurately set non-overlap times. Other objects and advantages of the invention will become apparent during the following description of the presently preferred embodiments of the invention taken in conjunction with the drawings.

DETAILED DESCRIPTION OF THE DRAWINGS

Figure 2:
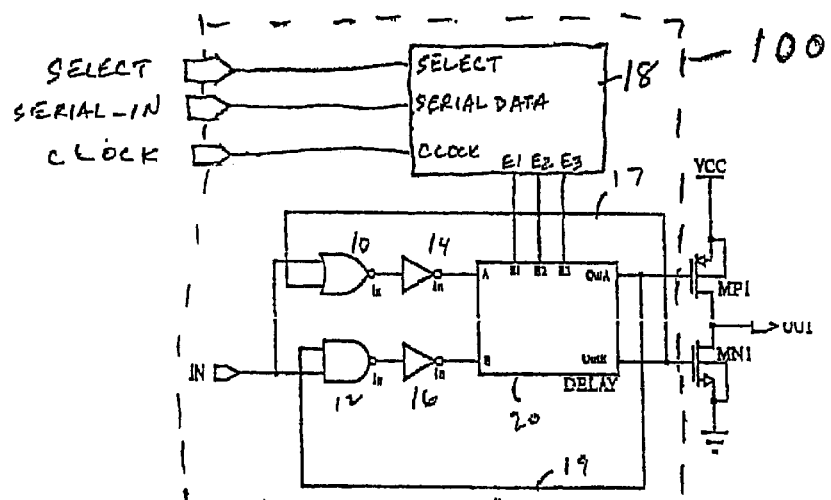
FIG. 2 is a schematic circuit diagram of an embodiment of a staggered dual output driver of the present invention.

A staggered dual output driver integrated circuit 100 of an embodiment of the present invention is shown in FIG. 2. The driven power stage is formed by two stacked output devices. The power stage includes top transistor MP1 and bottom transistor MN1 arranged with an output between the two devices. The staggered dual output driver is formed in an integrated circuit 100 with selectable delay paths 20, a cross-conduction prevention circuit and an encoder 18. The cross-conduction prevention circuit of the embodiment shown includes a NOR gate 10 followed by an inverter 14 and a NAND gate 12 followed by an inverter 16. A feedback path 17 is provided from the output of the NAND gate to an input of the NOR gate 10. A feedback path 19 is provided from the output of the NOR gate to the input of the NAND gate 12. Selectable delay paths 20 is inserted in the feedback paths. Due to the cross-conduction prevention, the outputs from NOR gate 10 and NAND gate 12 are staggered or successive so as to include a non-overlap time. The non-overlap time is the time period in which the driver outputs to the top and bottom output devices hold both output devices non-conducting. Some non-overlap time is developed by the gates of the cross-conduction circuit. For example, the NOR gate 10 and the NAND gate 12 may provide some delay. The inverters 14, 16 may provide some additional delay. As an example, the cross-conduction circuit may provide on the order of a couple nanoseconds of non-overlap time.

Figure 3:
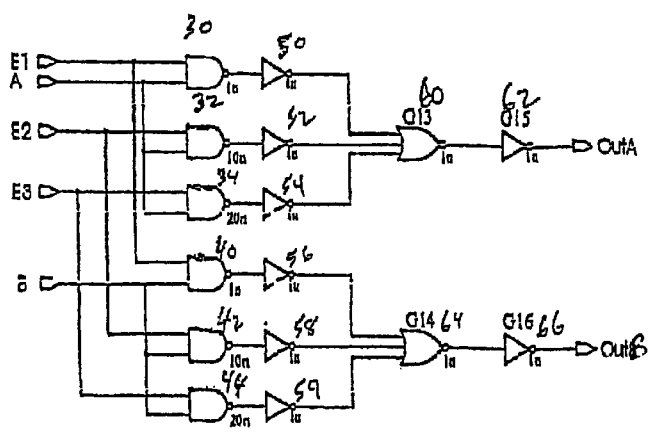
FIG. 3 is a schematic block diagram of selectable delay paths for use in the circuit of FIG. 2.

Advantageously, an additional delay to create an optimal non-overlap time may be achieved by selecting an optimal delay path from the selectable delay paths 20. The selectable delay paths 20 are shown in greater detail in FIG. 3. While only three delay paths for each of the two feedback paths are illustrated, it is expected that an actual circuit could be made with many more delay paths to provide even greater resolution for selecting an optimal non-overlap time. The selectable delay paths 20 include logic circuitry made up in this embodiment by a plurality of NAND gates for receiving the successive output signals from the cross-conduction prevention circuit. In FIG. 3, NAND gate 30, NAND gate 32 and NAND gate 34 are shown in connection with output A from the NOR gate 10. NAND gate 40, NAND gate 42 and NAND gate 44 are shown in connection with output B from the NAND gate 12 of the cross-conduction prevention circuit. Each of the NAND gates is part of a delay path emanating therefrom to provide a different time delay. For example NAND gate 30 is on a delay path with inverter 50, NOR gate 60 and inverter 62. Each of the elements in this path provide a one nanosecond delay making this a four nanosecond delay path. NAND gate 32 is in a delay path with inverter 52, NOR gate 60 and inverter 62. NAND gate 32 is constructed to provide a different delay from NAND gate 30. NAND gate 32 is given a ten nanosecond delay and each of the other elements of the path have a one nanosecond delay, the total delay of its path is 13 nanoseconds. NAND gate 34 is designed so as to give its delay path including inverter 54, NOR gate 60 and inverter 62 a delay of 23 nanoseconds. The different delay lengths of the various paths may be formed in accordance with conventional techniques. For example, by raising the CMOS gate lengths in the transistors of a logic gate, the delay in that gate is increased.

Encoder signal ports E1, E2 and E3 are used to receive signals that select from among the various delay paths. In accordance with a presently preferred embodiment, the delay paths for the two outputs A and B, are paired so that one encoder signal input selects a matched pair of delay paths for the two outputs A and B. In accordance with the logic circuitry shown in FIG. 3, selection of a delay path is made by providing a high signal on that delay path and a low signal on all the other delay paths. For example, by setting the input to encoder port E1 high and the inputs to encoder ports E2 and E3 low, the delay paths of NAND gate 30 and NAND gate 40 are selected. In a preferred embodiment, each of the delay paths connected to one of the cross-conduction prevention circuit outputs has a different delay associated with the conduction of signals thereon. A similar set of delay paths are provided for the other output. Delay paths with similar time delay are paired so that a single input may select the matched pair of delay paths, one for output A and one for output B.

Figure 1:
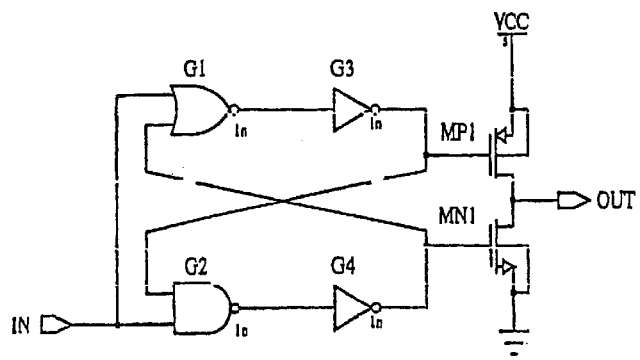
FIG. 1 is a schematic diagram of a cross-conduction prevention circuit of the prior art.

Due to variations in manufacturing processes, it is difficult to achieve an optimal delay path in a prior art circuit such as that shown in FIG. 1. The selectable delay paths 20 give the integrated circuit the ability to operate on any of a number of delay paths. Thus, according to a manufacturing process in accordance with the embodiment of the present invention, an integrated circuit is provided with a plurality of selectable delay paths to be inserted in a feedback path between an output and a logic gate that generates the other output. For example, the delay paths 20 are inserted between output A and the input to NAND gate 12 which produces output B. An optimal delay path can be determined by feeding input signals to the encoder signal ports to test a number of the various delay paths. It is not necessary to test all of the delay paths. Merely a plurality of the delay paths need be tested until the desired non-overlap time is detected. For each selected delay path, the circuit is tested to determine the non-overlap time produced by that delay path. After testing based on the various non-overlap time detected, one of the delay paths is selected for use by appropriately setting the encoder signal inputs.

In accordance with a preferred embodiment, an encoder 18 is included on the integrated circuit. Encoder 18 receives a serial signal which it converts to parallel outputs feeding the encoder signal inputs of the selectable delay paths 20. A test program can be run to control signals to the encoder and the integrated circuit so as to test the non-overlap times produced by a number of the delay paths. The encoder 18 is preferably an EPROM with a select input. The select input can be used to set the outputs from the encoder or to blow the EPROM with the desired outputs thereby permanently selecting the delay paths for use in the integrated circuit. Alternatively, an EEPROM could be used for the encoder which would permit setting the delay paths for an indefinite time and later resetting the circuit to use different delay paths. The encoder makes it easy to program the integrated circuits with any of the available delay paths.

Figure 4:
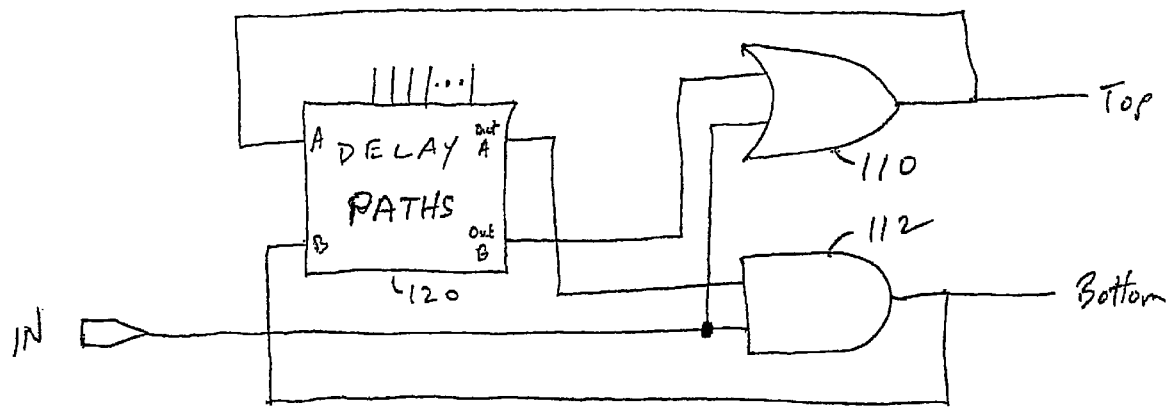
FIG. 4 is a schematic block diagram of an alternate embodiment of the present invention.

In the embodiment of FIG. 4, the output from the logic gates of the cross-conduction prevention circuit, OR gate 110 and AND gate 112, are used as the outputs of the staggered dual output driver to the power devices. The delay paths 120 are still inserted into the feedback paths between the output of one logic gate and the input of the other logic gate. In FIG. 4, the delay paths between A and Out A lead to the bottom output of the driver. The delay paths between B and Out B lead to the top output of the driver. The delay paths 120 are inserted in the feedback paths of the cross-conduction prevention circuit to make an integrated circuit in which the delay in the feedback paths and hence the non-overlap time can be determined through testing and then set to provide a staggered dual output driver with desired non-overlap times.

Figure 5:
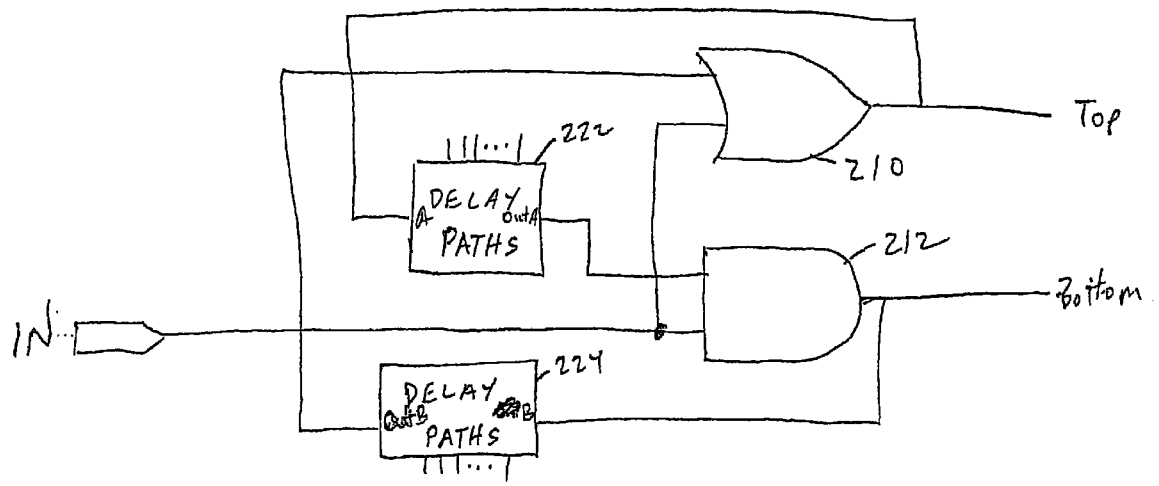
FIG. 5 is a schematic block diagram of a further alternate embodiment of the present invention.

A still further embodiment of the invention is shown in FIG. 5 in which the feedback path for each output from the cross-conduction prevention circuit has a separate set of delay paths. Thus, rather than pairing the delay paths, the delay may be independently set for each of the feedback paths. The cross-conduction prevention circuit is formed with OR gate 210 and AND gate 212. Delay paths 222 are inserted between the output from OR gate 210 and leads to the input to the AND gate 212. Delay paths 224 are inserted between the output from AND gate 212 and input to OR gate 210.

There may be applications where the optimal non-overlap time is not the same in both directions of signal switching. The embodiment of FIG. 5 accommodates such a situation, as the non-overlap time when switching to bottom off-top on can be set independent of the non-overlap time when switching to bottom on—top off. If switching in only one of these directions has requirements of accurate non-overlap time, an integrated circuit embodiment of the invention can be made with only one of the two selectable delay paths 222, 224, leaving the other direction to rely on manufacturing tolerances.

The operation of the staggered dual output driver will be explained with respect to FIG. 4 to illustrate how the delay paths impact the non-overlap time. With the input IN high, there will be a high signal on the top and bottom outputs to the stacked power devices. When configured as shown in FIG. 2, the bottom device will be on and the top device will be off. When the input IN changes to low, AND gate 112 responds by producing a low output to the bottom output of the staggered dual output driver. OR gate 110 still produces a high output because of the high signal from the delay paths 120. Thus, both output devices are off for a period of time. The low signal from AND gate 112 moves through the delay paths 120. When it gets to the OR gate 110, OR gate 110 produces a low signal to the top output thereby turning on the top output device. The bottom and top outputs switch successively. The length of non-overlap time in which both output devices are off is determined by the length of the delay through delay paths 120. In accordance with embodiments of the present invention, this delay time is programmable by providing a number of possible delay paths to choose from. The resolution with which one is able to pick out a non-overlap time depends on the number of delay paths and the size of the differences between the various available paths. Embodiments of the invention can be made with selectable delay paths in one or both feedback paths of the cross-conduction prevention circuit. With the delay paths in both feedback paths, the delay paths may be individually selectable or selectable in pairs.

It should be understood that various changes and modifications to the preferred embodiments described above will be apparent to those skilled in the art. Various cross-conduction prevention circuit designs may be substituted for those illustrated herein. The components used in the totem pole or push-pull stack of power devices may be of any variety of types that would benefit from non-overlap control in accordance with embodiments of the invention. These and other changes can be made without departing from the spirit and scope of the invention and without diminishing its attendant advantages. It is therefore intended that such changes and modifications be covered by the following claims.

What is claimed is:

1. A method for setting non-overlap time in a staggered dual output driver comprising: providing an integrated circuit with a plurality of delay paths for selective insertion in a feedback path between a first output and a logic gate for generating a second output;
selectively inserting each of a plurality of the delay paths into communication with the feedback path;
detecting non-overlap time of the staggered dual output driver for each of the selectively inserted delay paths; and
setting the integrated circuit to thereafter use one of the selectively inserted delay paths in communication with the feedback path.

2. The method of claim 1 further comprising feeding input signals to an encoder wherein said encoder produces signals that selectively insert delay paths into communication with the feedback path.

3. The method of claim 2 wherein said step of setting comprises providing a signal to said encoder to permanently select the one of the selectively inserted delay paths for use in communication with the feedback path.

4. A method for setting non-overlap time in a staggered dual output driver comprising:
providing an integrated circuit with a plurality of selectable paired delay paths, each pair of delay paths having one delay path for insertion in a first feedback path between a first output and a second logic gate for generating a second output and a second delay path for insertion in a second feedback path between the second output and a first logic gate for generating the first output;
testing a plurality of the delay path pairs and detecting non-overlap time for each of the tested delay path pairs; and
setting the integrated circuit to use one of the tested delay path pairs.

5. The method of claim 4 further comprising feeding input signals to an encoder wherein said encoder produces signals that selectively insert one of the pairs of delay paths into communication with the first and second feedback paths.

6. The method of claim 5 wherein said step of setting comprises providing a signal to said encoder to permanently select the one of the tested delay path pairs for use in communication with the first and second feedback paths.

7. A staggered dual output circuit comprising:
a first logic circuit for generating a first output;
a second logic circuit for generating a second output;
a feedback path from the first output to the second logic circuit;
a second feedback path from the second output to the first logic circuit; and
an encoder permitting selection of any of a plurality of delay paths for insertion into said first feedback path.

8. The dual output circuit of claim 7 wherein said encoder further permits selection of one of a plurality of delay paths for insertion into said second feedback path.

9. The dual output circuit of claim 7 wherein said encoder comprises an EPROM.

10. The dual output circuit of claim 7 wherein said first logic circuit comprises a NOT OR gate and said second logic circuit comprises a NAND gate.

11. The dual output circuit of claim 7 wherein said first logic circuit comprises an OR gate and said second logic circuit comprises an AND gate.

12. A staggered dual output driver circuit comprising:
a cross conduction prevention circuit that provides a first output signal to a first feedback path and a second output signal to a second feedback path;
a first plurality of delay paths for selective insertion into the first feedback path; and
encoder signal ports for receiving signals that select one delay path of said first plurality of delay paths for insertion into the first feedback path.

13. The staggered dual output driver circuit of claim 12 further comprising an encoder connected to said encoder signal ports, said encoder having a select input for permanently selecting one delay path of said first plurality of delay paths for insertion into the first feedback path.

14. The staggered dual output driver circuit of claim 12 further comprising a second plurality of delay paths for selective insertion into the second feedback path.

15. The staggered dual output driver circuit of claim 14 further comprising encoder signal ports for receiving signals that select one delay path of said first plurality of delay paths for insertion into the first feedback path and one delay path of said second plurality of delay paths for insertion into the second feedback path.

16. The staggered dual output driver circuit of claim 15 wherein said first plurality of delay paths and said second plurality of delay paths are paired so that a signal on the encoder signal ports selects a pair of delay paths.

17. The staggered dual output driver circuit of claim 16 further comprising an encoder connected to said encoder signal ports, said encoder having a select input for permanently selecting one pair of delay paths for insertion into the first and second feedback paths.

18. The staggered dual output driver circuit of claim 17 wherein said encoder comprises an EPROM.

19. In an integrated circuit having a staggered dual output circuit for converting an input into a pair of successive signals, an improvement comprising:
   a logic circuit connected to receive the pair of successive signals;
   a first plurality of delay paths emanating from said logic circuit and leading to a top output;
   a second plurality of delay paths emanating from said logic circuit and leading to a bottom output; and
   a selection input to said logic circuit for determining which of the delay paths will conduct between the pair of successive signals and the top and bottom outputs.

20. The integrated circuit of claim 19 further comprising an encoder connected to provide said selection input.

21. The integrated circuit of claim 20 wherein said encoder comprises an EPROM.

22. The integrated circuit of claim 19 wherein said logic circuit comprises a plurality of NAND gates each NAND gate forming a portion of one of the delay paths of said first and second delay paths.

23. The integrated circuit of claim 22 wherein said plurality of NAND gates exhibit a variety of signal delays.

* * * * *